US012796408B2

(12) United States Patent
Hong et al.

(10) Patent No.: US 12,796,408 B2
(45) Date of Patent: Nov. 10, 2026

(54) TEST SUBSTRATE, TEST DEVICE, AND TEST METHOD

(71) Applicant: SAMSUNG ELECTRONICS CO., LTD., Suwon-si (KR)

(72) Inventors: Changui Hong, Suwon-si (KR); Minho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 621 days.

(21) Appl. No.: 18/213,967

(22) Filed: Jun. 26, 2023

(65) Prior Publication Data

US 2024/0136237 A1 Apr. 25, 2024
US 2024/0234221 A9 Jul. 11, 2024

(30) Foreign Application Priority Data

Oct. 19, 2022 (KR) ........................ 10-2022-0134610

(51) Int. Cl.
*H10P 74/00* (2026.01)
*G01R 31/52* (2020.01)
(Continued)

(52) U.S. Cl.
CPC ............ *H10P 74/273* (2026.01); *G01R 31/52* (2020.01); *G01R 31/64* (2020.01); *H10D 1/716* (2025.01);
(Continued)

(58) Field of Classification Search
CPC ............... H01L 22/32; H01L 23/49805; H01L 23/49838; H01L 23/50; H01L 22/34;
(Continued)

(56) References Cited

U.S. PATENT DOCUMENTS 5,568,346 A * 10/1996 Orchard-Webb .... H10D 89/611 361/111
7,279,921 B1 * 10/2007 Iacob ............... G01R 31/31721 324/537
(Continued)

FOREIGN PATENT DOCUMENTS

JP 2003-14819 A 1/2003
JP 2004-156956 A 6/2004
(Continued)

OTHER PUBLICATIONS

Communication issued Jan. 2, 2026 by the Korean Ministry of Intellectual Property in Korean Patent Application No. 10-2022-0134610.
Notice of Allowance issued Oct. 5, 2026 by the Ministry of Intellectual Property, Republic of Korea, in Korean Application No. 10-2022-0134610.

*Primary Examiner* — Akm Zakaria
(74) *Attorney, Agent, or Firm* — Sughrue Mion, PLLC

(57) ABSTRACT

A substrate includes a first input/output region; a first input pad provided in the first input/output region; a first output pad provided in the first input/output region; a first mounting region; a first positive pad provided in the first mounting region and connected to the first input pad; a first negative pad provided in the first mounting region connected to the first output pad; a second positive pad provided in the first mounting region; a second negative pad provided in the first mounting region; a second mounting region; a third positive pad provided in the second mounting region and connected to the second positive pad; a third negative pad provided in the second mounting region and connected to the second negative pad; a fourth positive pad provided in the second mounting region; a fourth negative pad provided in the second mounting region; a second input/output region; a second input pad provided in the second input/output region
(Continued)

and connected to the fourth positive pad; and a second output pad provided in the second input/output region and connected to the fourth negative pad.

17 Claims, 18 Drawing Sheets

(51) Int. Cl.

| | |
|---|---|
| ***G01R 31/64*** | (2020.01) |
| ***H10D 1/68*** | (2025.01) |
| ***H10W 70/65*** | (2026.01) |

(52) U.S. Cl.
CPC ......... *H10W 70/65* (2026.01); *H10W 70/657* (2026.01)

(58) Field of Classification Search
CPC ................. H01L 23/525; H01L 23/528; H01L 23/535; G01R 31/52; G01R 31/64; G01R 31/2853; G01R 31/2896; H10D 1/716; H05K 1/0231; H05K 1/111; H05K 2201/10015; H05K 1/0268; H05K 3/3442
See application file for complete search history.

(56) References Cited

U.S. PATENT DOCUMENTS

| | | | | |
|---|---|---|---|---|
| 7,391,219 | B2 | 6/2008 | Ahiko et al. | |
| 7,593,202 | B2 * | 9/2009 | Khazhinsky | H02H 9/046 361/56 |
| 2006/0001101 | A1 * | 1/2006 | Hirata | H10D 89/601 257/355 |
| 2008/0012046 | A1 * | 1/2008 | Ojiro | H01L 22/32 257/E23.153 |
| 2014/0091428 | A1 | 4/2014 | Hossain et al. | |
| 2016/0254658 | A1 * | 9/2016 | Jacobson | H02H 3/08 361/91.5 |

FOREIGN PATENT DOCUMENTS

| | | | |
|---|---|---|---|
| JP | 4757695 | B2 | 6/2011 |
| JP | 5338084 | B2 | 11/2013 |
| KR | 10-0828512 | B1 | 5/2008 |
| KR | 10-2015-0083572 | A | 7/2015 |
| KR | 10-2022-0136754 | A | 10/2022 |

* cited by examiner

200

TEST SUBSTRATE, TEST DEVICE, AND TEST METHOD

CROSS-REFERENCE TO RELATED APPLICATION

This application claims priority to Korean Patent Application No. 10-2022-0134610, filed on Oct. 19, 2022, in the Korean Intellectual Property Office, the disclosure of which is incorporated herein by reference in its entirety.

BACKGROUND

The present disclosure relates to a test substrate, a test apparatus and a test method.

A capacitor may be connected to a semiconductor package including at least one semiconductor chip. As an example, a capacitor may be connected to an intellectual property (IP) consuming a large amount of current in a semiconductor chip to function as a current source. A process of connecting a capacitor to a semiconductor package includes a mounting process of attaching the capacitor to a package substrate. If the mounting process is not properly controlled, open-circuit faults and/or short-circuit faults may occur. Accordingly, a test process for properly controlling a mounting process for mounting capacitors on a package substrate may be advantageous. However, in order to test for each of the open-circuit faults and the short faults that may occur while mounting the capacitor, a plurality of pads providing different equivalent circuits are required, and a short capacitor needs to be additionally manufactured and used for the test, resulting in an increase in costs and time required for a test operation.

SUMMARY

Example embodiments of the present disclosure provide a test substrate, a test device, and a test method capable of testing both an open-circuit fault and a short-circuit fault that may occur when a capacitor is mounted with a single connection. Accordingly, costs and time required for a test operation for optimizing a process of mounting a capacitor may be reduced.

According to an aspect of an example embodiment, a substrate includes: a first input/output region; a first input pad provided in the first input/output region; a first output pad provided in the first input/output region; a first mounting region; a first positive pad provided in the first mounting region and connected to the first input pad; a first negative pad provided in the first mounting region connected to the first output pad; a second positive pad provided in the first mounting region; a second negative pad provided in the first mounting region; a second mounting region; a third positive pad provided in the second mounting region and connected to the second positive pad; a third negative pad provided in the second mounting region and connected to the second negative pad; a fourth positive pad provided in the second mounting region; a fourth negative pad provided in the second mounting region; a second input/output region; a second input pad provided in the second input/output region and connected to the fourth positive pad; and a second output pad provided in the second input/output region and connected to the fourth negative pad.

According to an aspect of an example embodiment, a device includes: a substrate includes: a plurality of mounting regions; a plurality of four-terminal capacitors that are mounted in the plurality of mounting regions; a first input/output region electrically connected to a first mounting region from among the plurality of mounting regions; a second input/output region electrically connected to a second mounting region from among the plurality of mounting regions; and a controller configured to determine whether mounting faults of the plurality of four-terminal capacitors occur when the plurality of four-terminal capacitors are mounted in the plurality of mounting regions, by applying an electrical signal to each of the first input/output region and the second input/output region.

According to an aspect of an example embodiment, a method includes: mounting capacitors in a first mounting region and a second mounting region of a substrate, wherein a plurality of pads are provided in each of the first mounting region and the second mounting region; inputting an electrical signal to a first input pad connected to a first pad from among the plurality of pads provided in the first mounting region; detecting the electrical signal from a first output pad connected to a second pad from among the plurality of pads provided in the first mounting region, and a second input pad connected to a third pad from among the plurality of pads provided in the second mounting region; and determining whether a fault has occurred in the mounting the capacitors, based on the electrical signal being detected from the first output pad or the electrical signal not being detected from the second input pad.

BRIEF DESCRIPTION OF DRAWINGS

The above and other aspects, features, and advantages will be more clearly understood from the following detailed description of example embodiments taken in conjunction with the accompanying drawings, in which.

DETAILED DESCRIPTION

Figure 1:
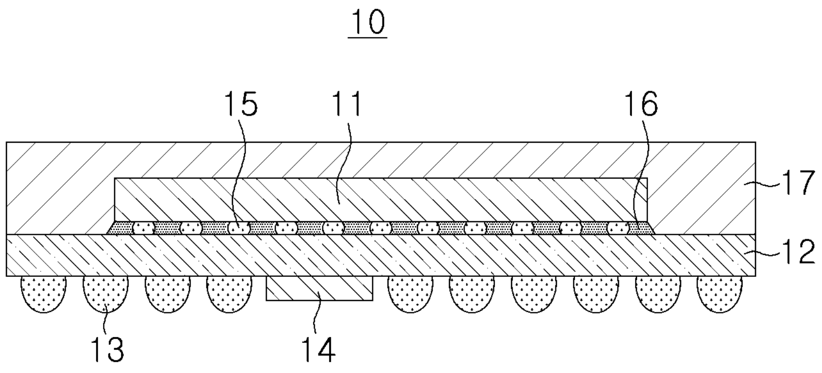
FIG. 1 is a schematic diagram illustrating a semiconductor package according to one or more example embodiments.

Hereinafter, example embodiments will be described with reference to the accompanying drawings. The same reference numerals are used for the same components in the drawings, and duplicate descriptions thereof are omitted.

FIG. 1 is a schematic diagram illustrating a semiconductor package according to one or more example embodiments.

Referring to one or more example embodiments shown in FIG. 1, a semiconductor package 10 according to one or more example embodiments may include a semiconductor chip 11, a package substrate 12, external connection terminals 13, a capacitor 14, connection terminals 15, a first mold layer 16, a second mold layer 17, and the like. The semiconductor chip 11 may be a device including, but not limited to, an application processor (AP), a flash memory, a dynamic random-access memory ("DRAM"), or the like, and two or more semiconductor chips 11 may be simultaneously mounted on the package substrate 12 in one or more example embodiments.

The package substrate 12 may include a redistribution layer, and the redistribution layer may be connected to the semiconductor chip 11 through the connection terminals 15. The redistribution layer may be connected to an external device different from the semiconductor package 10 through the external connection terminals 13. The redistribution layer may be formed on a base layer of the package substrate 12. As an example, the base layer may include a semiconductor material or an insulating material.

The connection terminals 15 may connect the semiconductor chip 11 to the package substrate 12, and may be electrically connected to chip pads formed on the semiconductor chip 11 and a redistribution layer formed on the package substrate 12. The connection terminals 15 may be covered by a first mold layer 16 provided between the semiconductor chip 11 and the package substrate 12. The first mold layer 16 may be formed of a polymer material including, but not limited to, an epoxy molding compound.

The external connection terminals 13 may be formed on a lower surface of the package substrate 12, and may be connected to the redistribution layer of the package substrate 12. Through the external connection terminals 13, the semiconductor package 10 may exchange signals with other external devices. Each of the external connection terminals 13 may be a solder bump connected to the redistribution layer.

A second mold layer 17 may be formed on the semiconductor chip 11 and the package substrate 12. The second mold layer 17 may be formed to cover the semiconductor chip 11 and, may be formed of a polymer material having insulating properties in a same manner as that of the first mold layer 16. In one or more example embodiments, the first mold layer 16 and the second mold layer 17 may be formed of the same material or different materials.

Referring to one or more example embodiments shown in FIG. 1, the capacitor 14 may be mounted on a lower surface of the package substrate 12. The capacitor 14 may be connected to the semiconductor chip 11 through the redistribution layer of the package substrate 12. As an example, the capacitor 14 may be connected to an IP, for example, a core or a central processing unit (CPU), which may consume a large amount of current in a semiconductor chip to function as a current source. In other words, the capacitor 14 may be charged by power supplied to the semiconductor package 10, and the IP connected to the capacitor 14 in the semiconductor chip 11 may use the capacitor 14 as a current source, if necessary.

As an example, the capacitor 14 may be a multilayer capacitor. The capacitor 14 may include a plurality of electrodes stacked within a body, and the plurality of electrodes may be classified according to polarity thereof and may be connected to terminals exposed to the outside of the body. Terminals of the capacitor 14 may be coupled to pads formed on the lower surface of the package substrate 12.

As illustrated according to one or more example embodiments shown in FIG. 1, in configuring the semiconductor package 10 including the capacitor 14, a fault may occur during a process of mounting the capacitor 14 on the package substrate 12. The capacitor 14 may be attached to the pads formed on the lower surface of the package substrate 12 through a solder bump. If solder bumps connected to terminals of the capacitor 14 having different polarities are connected to each other, or mounted, the inside of the capacitor 14 may be damaged due to pressure applied to the capacitor 14, resulting in a short-circuit fault.

In addition, an open-circuit fault may also occur during a process of mounting the capacitor 14 on the lower surface of the package substrate 12. For example, the solder bump may not be sufficiently filled in a space between the pad of the package substrate 12 and the terminal of the capacitor 14, such that the terminal of the capacitor 14 may not be completely connected to the pad, and thus an open-circuit fault may occur. Alternatively, an open-circuit fault may occur due to damage to the inside of the capacitor 14 or due to damage to the pad of the package substrate 12 during a process of mounting the capacitor 14 and/or other processes.

Accordingly, in order to optimize a mounting process of attaching the capacitor 14 to the package substrate 12, the mounting process may need to be tested in advance. If, according to one or more example embodiments, the capacitor 14 is a four-terminal capacitor including four terminals, the capacitor 14 may include a pair of positive terminals and a pair of negative terminals. Assuming that no faults occur during the process of mounting the capacitor 14, the pair of positive terminals are electrically isolated from the pair of negative terminals, and all terminals may be accurately attached to the pads of the package substrate 12. Conversely, if at least one of the pair of positive terminals and the pair of negative terminals is not accurately connected to the pad, or if the pair of positive terminals are isolated from each other or the pair of negative terminals are isolated from each other due to a crack occurring in the inside of the capacitor 14, an open-circuit fault may occur. If at least one of the positive terminals is connected to at least one of the negative terminals during the mounting process, a short-circuit fault may occur.

In one or more example embodiments, there may be proposed a method of rapidly performing a test operation for optimizing the process of mounting the capacitor 14 at low cost. As an example, a package substrate may be provided having two or more mounting regions in which the capacitor 14 is mountable, and the mounting regions of the package substrate may be connected to each other between input/output regions. Each of the input/output regions may include an input pad and an output pad.

In one or more example embodiments, both an open-circuit fault and a short-circuit fault may be tested depending on how an input pad and an output pad are selected in each of input/output regions after the capacitor 14 is attached to a mounting region by performing a mounting process. In other words, it may not be necessary to prepare mounting regions for respectively testing the open-circuit fault and the short-circuit fault on a test substrate, or to mount the capacitor 14 on the test substrate several times, such that a test operation may be rapidly performed at low cost. An operation of mounting the capacitor 14 on the actual semiconductor package 10 may be performed under a condition if no fault is detected in a test operation performed after the capacitor 14 is mounted in a mounting region, thereby improving a yield of a p process.

Figure 2:
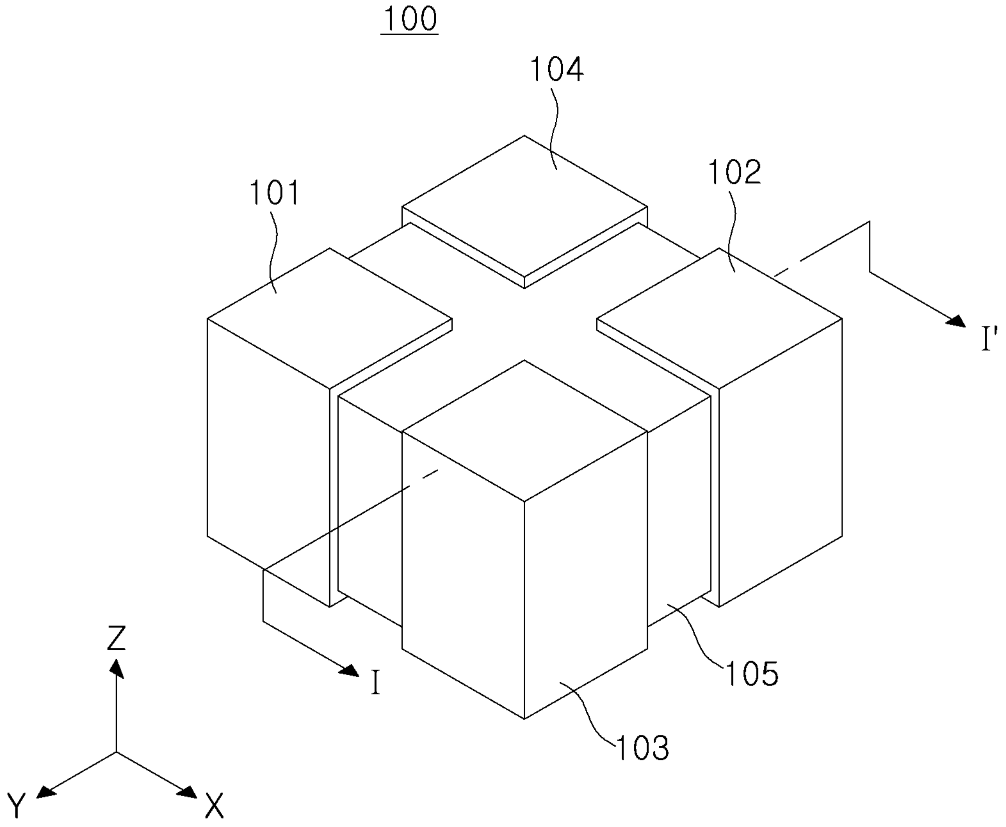
FIGS. 2, 3 and 4 are schematic diagrams illustrating a capacitor as a test target of a test method according to one or more example embodiments.
Figure 3:
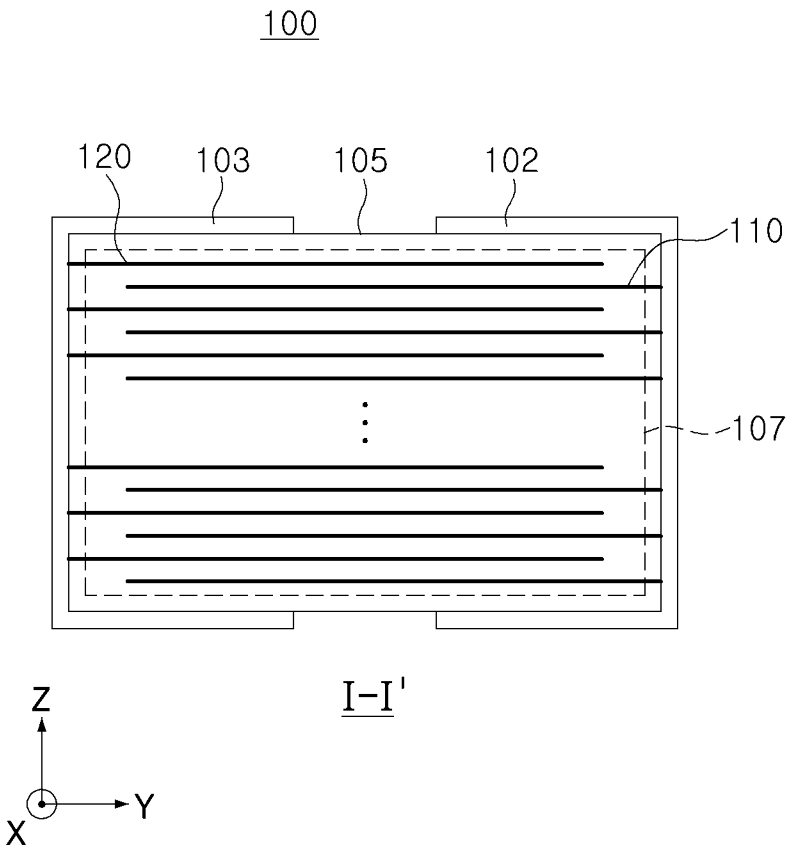
Figure 4:
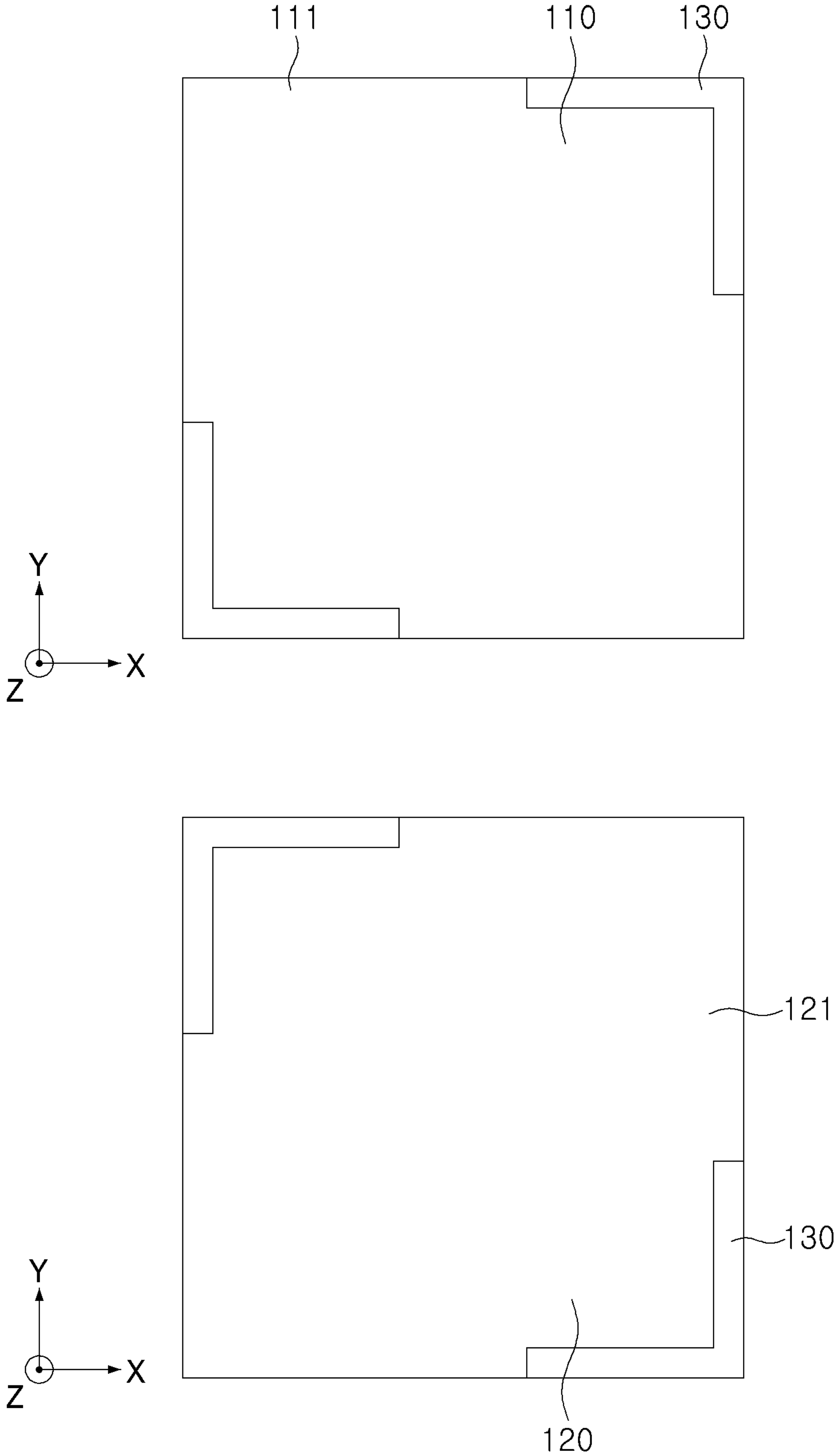

FIGS. 2, 3 and 4 are schematic diagrams illustrating a capacitor as a test target of a test method according to one or more example embodiments.

Referring to FIGS. 2, 3 and 4, a capacitor 100, a test target of a test method according to one or more example embodiments, may be a four-terminal capacitor having four terminals 101, 102, 103 and 104 exposed to the outside of the body 105. Referring to one or more example embodiments shown in FIG. 2, the four terminals 101, 102, 103 and 104 included in the capacitor 100 may be positioned at corners of the body 105. However, in one or more example embodiments, the positions of the four terminals 101, 102, 103 and 104 may be modified in various manners. As an example, the four terminals 101, 102, 103 and 104 may be isolated from the corners of the body 105 and may be positioned at edges of the body 105.

FIG. 3 is a cross-sectional view illustrating a cross-section taken along line I-I' of FIG. 2, according to one or more example embodiments. Referring to one or more example embodiments shown in FIG. 3, the capacitor 100 may include a plurality of internal electrodes 110 and 120 stacked in an internal space 107 of the body 105. The plurality of internal electrodes 110 and 120 may include a plurality of first internal electrodes 110 and a plurality of second internal electrodes 120, and the plurality of first internal electrodes 110 and the plurality of second internal electrodes 120 may be alternately stacked in a Z-axis direction.

Referring to one or more example embodiments shown in FIG. 4, each of the plurality of first internal electrodes 110 and the plurality of second internal electrodes 120 may include a dielectric layer 130. Each of the plurality of first internal electrodes 110 may include a pair of first lead portions 111 provided along a first diagonal direction, intersecting an X-axis direction and a Y-axis direction. Each of the plurality of second internal electrodes 120 may include a pair of second lead portions 121 provided along a second diagonal direction, intersecting the first diagonal direction.

As an example, the first lead portion 111 may be connected to a first terminal 101 and a second terminal 102, and the second lead portion 121 may be connected to a third terminal 103 and a fourth terminal 104. The first terminal 101 and the second terminal 102 may provide a pair of positive terminals, and the third terminal 103 and the fourth terminal 104 may provide a pair of negative terminals. The first terminal 101 and the second terminal 102 may be electrically connected to each other by the plurality of first internal electrodes 110, and the third terminal 103 and the fourth terminal 104 may be electrically connected to each other by the plurality of second internal electrodes 120.

If at least some of the plurality of first internal electrodes 110 and the plurality of second internal electrodes 120 are damaged by force applied to the capacitor 100 during the process of mounting the capacitor 100, then the first terminal 101 may be electrically isolated from the second terminal 102, or the third terminal 103 may be electrically isolated from the fourth terminal 104. In this case, an open-circuit fault may occur during the process of mounting the capacitor 100. At least one of the plurality of first internal electrodes 110 may come into contact with at least one of the second internal electrodes 120 within the body 105 due to force applied to the capacitor 100 during the process of mounting the capacitor 100. In this case, a short-circuit fault may occur during the process of mounting the capacitor 100.

Figure 5:
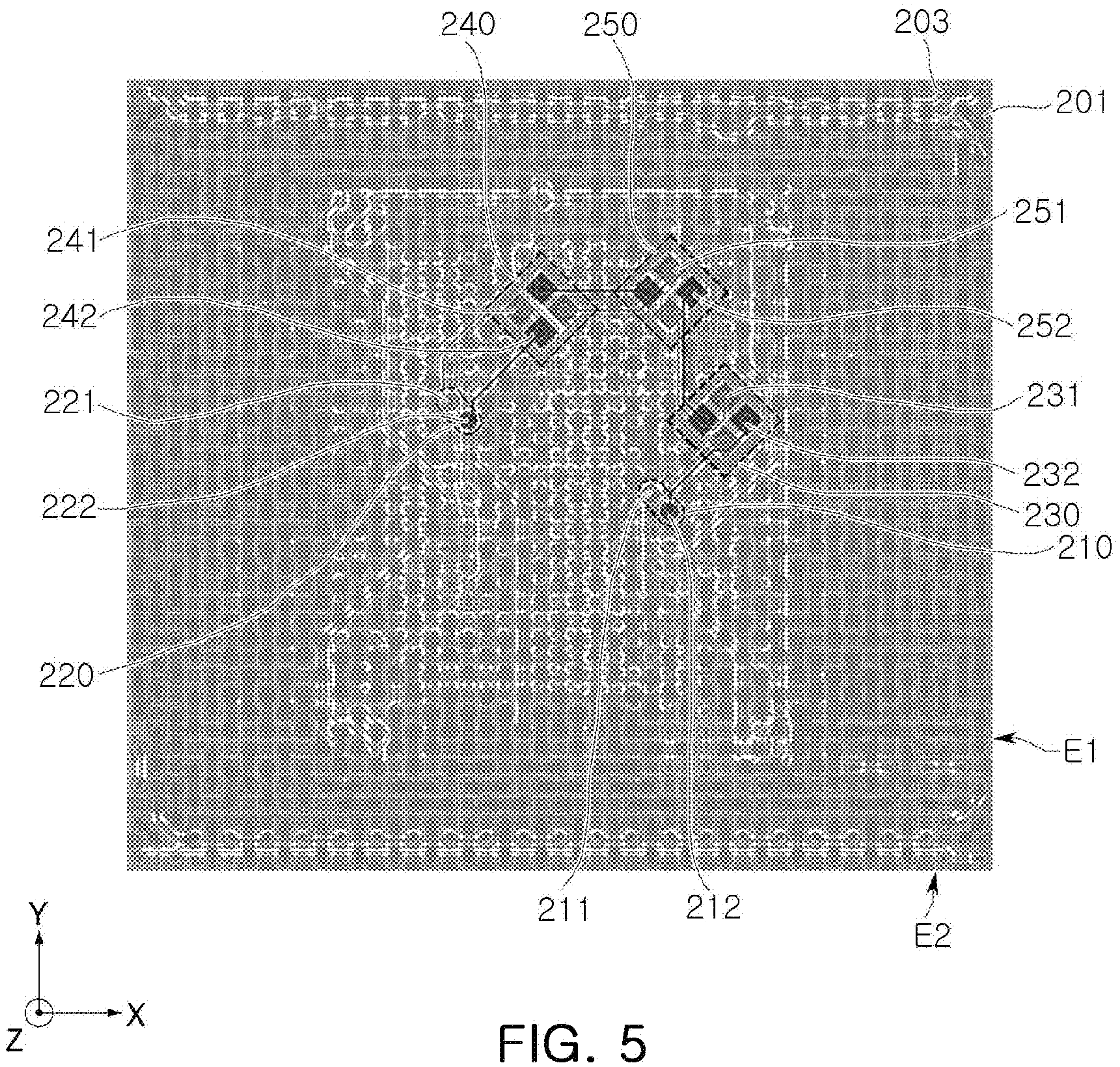
FIG. 5 is a schematic plan view illustrating a test substrate according to one or more example embodiments.

FIG. 5 is a schematic plan view illustrating a test substrate according to one or more example embodiments.

Referring to one or more example embodiments shown in FIG. 5, a test substrate 200 according to one or more example embodiments may include a first input/output region 210, a second input/output region 220, and a plurality of mounting regions 230, 240 and 250. The plurality of mounting regions 230, 240 and 250 may be connected between the first input/output region 210 and the second input/output region 220. In one or more example embodiments illustrated in FIG. 5, three mounting regions 230, 240 and 250 are connected between the first input/output region 210 and the second input/output region 220, but such a configuration is merely one or more example embodiments and the number of mounting regions 230, 240 and 250 may be modified in various manners.

The test substrate 200 may include a base layer 201 and a plurality of interconnection patterns 203. The base layer 201 may have a first edge E1 extending in a first direction (Y-axis direction), and a second edge E2 extending in a second direction (X-axis direction).

A plurality of pads may be disposed in each of the first input/output region 210, the second input/output region 220, and the plurality of mounting regions 230, 240 and 250. As an example, a first input pad 211 and a first output pad 212 may be disposed in the first input/output region 210, and a second input pad 221 and a second output pad 222 may be disposed in the second input/output region 220.

A pair of positive pads and a pair of negative pads may be disposed in each of the plurality of mounting regions 230, 240 and 250. A pair of positive pads 231 arranged in a first direction and a pair of negative pads 232 arranged in a second direction may be disposed in a first mounting region 230. One of the pair of positive pads 231 may be connected to the first input pad 211 through a first interconnection pattern, and one of the pair of negative pads 232 may be connected to the first output pad 212 through a second interconnection pattern.

A pair of positive pads 241 arranged in a second direction and a pair of negative pads 242 arranged in a first direction may be disposed in a second mounting region 240. One of the pair of positive pads 241 may be connected to the second input pad 221 through a third interconnection pattern, and one of the pair of negative pads 242 may be connected to a second output pad 222 through a fourth interconnection pattern.

A third mounting region 250 may be connected between the first mounting region 230 and the second mounting region 240. A pair of positive pads 251 and a pair of negative pads 252 may be disposed in the third mounting region 250. One of the pair of positive pads 251 may be connected to one, from among the pair of positive pads 231 disposed in the first mounting region 230, that is not connected to the first input pad 211. The other one of the pair of positive pads 251 may be connected to one, from among the pair of positive pads 241 disposed in the second mounting region 240, that is not connected to the second input pad 221.

One of the pair of negative pads 252 disposed in the third mounting region 250 may be connected to one, from among the pair of negative pads 232 disposed in the first mounting region 230, that is not connected to the first output pad 212. The other one of the pair of negative pads 252 may be connected to the other one, from among the pair of negative pads 242 disposed in the second mounting region 240, that is not connected to the second output pad 222.

In other words, in a state in which a capacitor is not mounted in each of the plurality of mounting regions 230, 240 and 250, the pairs of positive pads 231, 241, and 251 and the pairs of negative pads 232, 242, and 252, may be electrically isolated from each other. In one or more example embodiments, a capacitor may be mounted in each of the plurality of mounting regions 230, 240 and 250, and some from among the first input pad 211, the first output pad 212, the second input pad 221, and the second output pad 222 may be selected to apply and detect an electrical signal, thereby testing whether a short-circuit fault or an open-circuit fault has occurred during a mounting process of attaching the capacitor to the test substrate 200.

Figure 6:
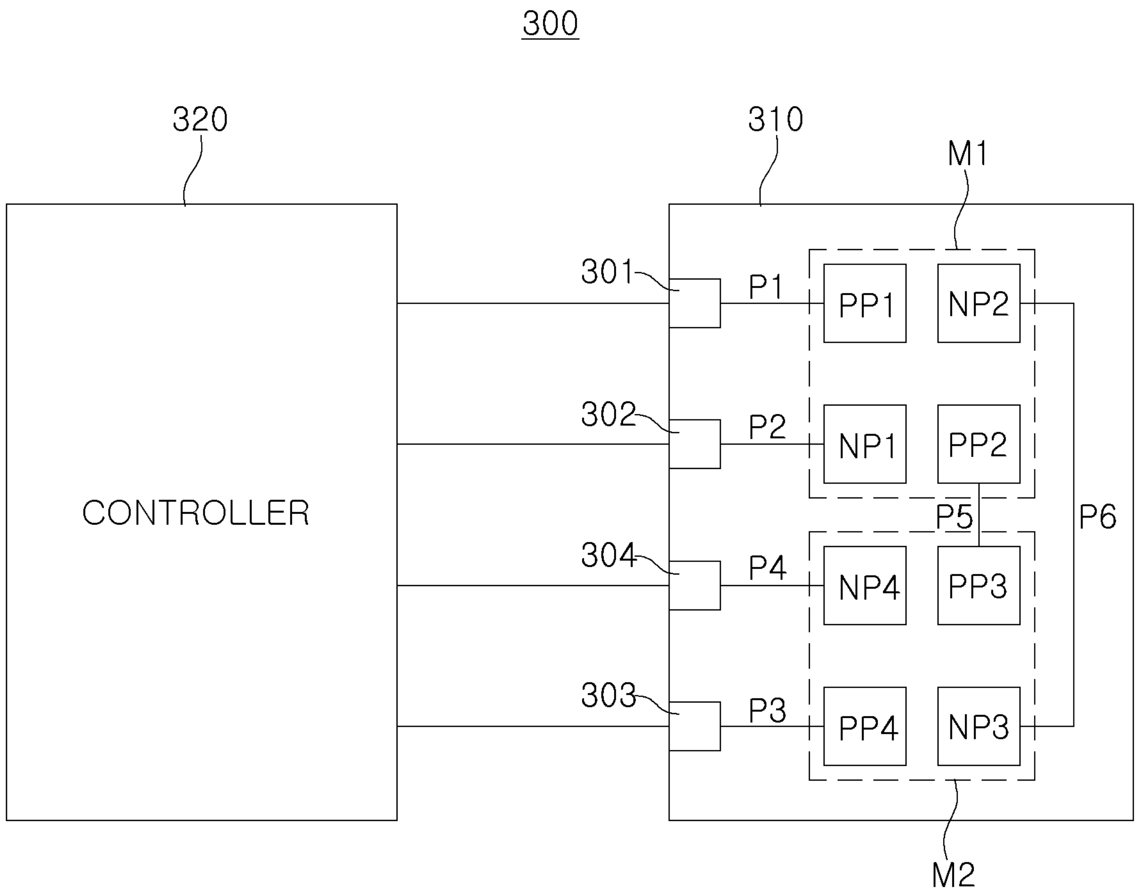
FIG. 6 is a schematic block diagram illustrating a test device according to one or more example embodiments.

FIG. 6 is a schematic block diagram illustrating a test device according to one or more example embodiments.

Referring to one or more example embodiments shown in FIG. 6, a test device 300 according to one or more example embodiments may include a test substrate 310 and a controller 320. The test substrate 310 may include input/output pads 301, 302, 303 and 304 connected to the controller 320, and a first mounting region M1 and a second mounting region M2 disposed between the input/output pads 301, 302, 303 and 304. A plurality of pads PP1, PP2, PP3 and PP4 and NP1, NP2, NP3 and NP4 may be disposed in each of the first mounting region M1 and the second mounting region M2. The controller 320 may be a processor.

As an example, a first positive pad PP1, a second positive pad PP2, a first negative pad NP1, and a second negative pad NP2 may be disposed in the first mounting region M1. The first positive pad PP1 may be connected to a first input pad 301, and the first negative pad NP1 may be connected to a first output pad 302. In the first mounting region M1, the first positive pad PP1, the second positive pad PP2, the first negative pad NP1, and the second negative pad NP2 may be isolated from each other without being connected to each other.

A third positive pad PP3, a fourth positive pad PP4, a third negative pad NP3, and a fourth negative pad NP4 may be disposed in the second mounting region M2. The fourth positive pad PP4 may be connected to a second input pad 303, and the fourth negative pad NP4 may be connected to a second output pad 304. In the second mounting region M2, the third positive pad PP3, the fourth positive pad PP4, the third negative pad NP3, and the fourth negative pad NP4 may be isolated from each other without being connected to each other.

The test substrate 310 may include a plurality of interconnection patterns P1, P2, P3, P4, P5 and P6. A first interconnection pattern P1 may connect the first input pad 301 to the first positive pad PP1, and a second interconnection pattern P2 may connect the first output pad 302 to the first negative pad NP1. A third interconnection pattern P3 may connect the second input pad 303 to the fourth positive pad PP4, and a fourth interconnection pattern P4 may connect the second output pad 304 to the first negative pad NP4. A fifth interconnection pattern P5 may connect the second positive pad PP2 to the third positive pad PP3, and a sixth interconnection pattern P6 may connect the second negative pad NP2 to the third negative pad NP3.

A capacitor attached to the test substrate 310 by a mounting process may be a four-terminal capacitor, as described above with reference to FIGS. 2, 3 and 4. Referring to one or more example embodiments illustrated in FIG. 2, together, the first terminal 101 of the capacitor 100 mounted in the first mounting region may be connected to the first positive pad PP1 and the second terminal 102 may be connected to the second positive pad PP2. The third terminal 103 of the capacitor 100 may be connected to the first negative pad NP1, and the fourth terminal 104 may be connected to the second negative pad NP2. A connection relationship between the capacitor 100 mounted in the second mounting region M2 and the pads PP3, PP4, NP3, and NP4 may be similar to that of the first mounting region M1.

If the capacitor 100 is mounted in each of the first mounting region M1 and the second mounting region M2, then the controller 320 may apply an electrical signal to one of the input/output pads 301, 302, 303 and 304 and detect an electrical signal from another one of the input/output pads 301, 302, 303 and 304 to test whether a fault has occurred during a mounting process in which the capacitor 100 is mounted in each of the first mounting region M1 and the second mounting region M2. As an example, the controller 320 may detect whether a short-circuit fault has occurred during the mounting process by applying an electrical signal to the first input pad 301 and by detecting the electrical signal from the first output pad 302. The controller 320 may apply an electrical signal to the first input pad 301 and may detect the electrical signal from the second input pad 303 to detect whether an open-circuit fault has occurred during the mounting process.

If the controller 320 determines that an open-circuit fault or a short fault has been detected in the mounting process, then the mounting process of attaching the capacitor 100 to a package substrate of a semiconductor package may be modified. As an example, if an open-circuit fault has occurred, then a force for attaching the capacitor 100 to the package substrate may be increased during the mounting process, or the quantity of solder bumps inserted between the capacitor 100 and the package substrate may be increased to allow a pad of the package substrate to be more securely connected to the capacitor 100. If a short-circuit fault has occurred, then the quantity of solder bumps may be reduced, thereby preventing solder bumps attached to pads having different polarities from being connected to each other by the mounting process.

Figure 7:
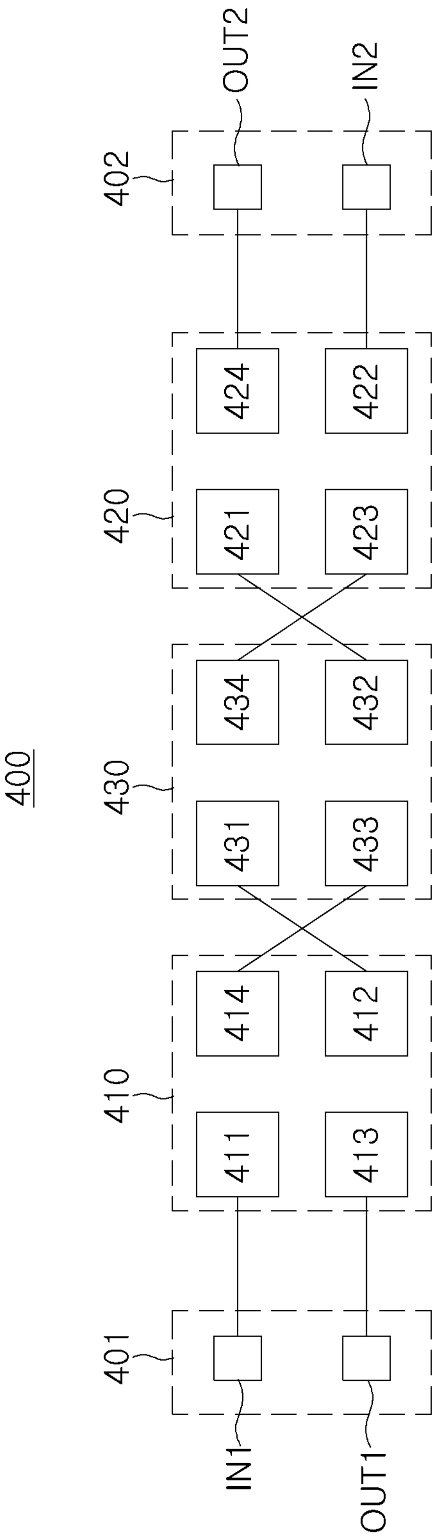
FIGS. 7 and 8 are diagrams illustrating a test substrate according to one or more example embodiments.
Figure 8:
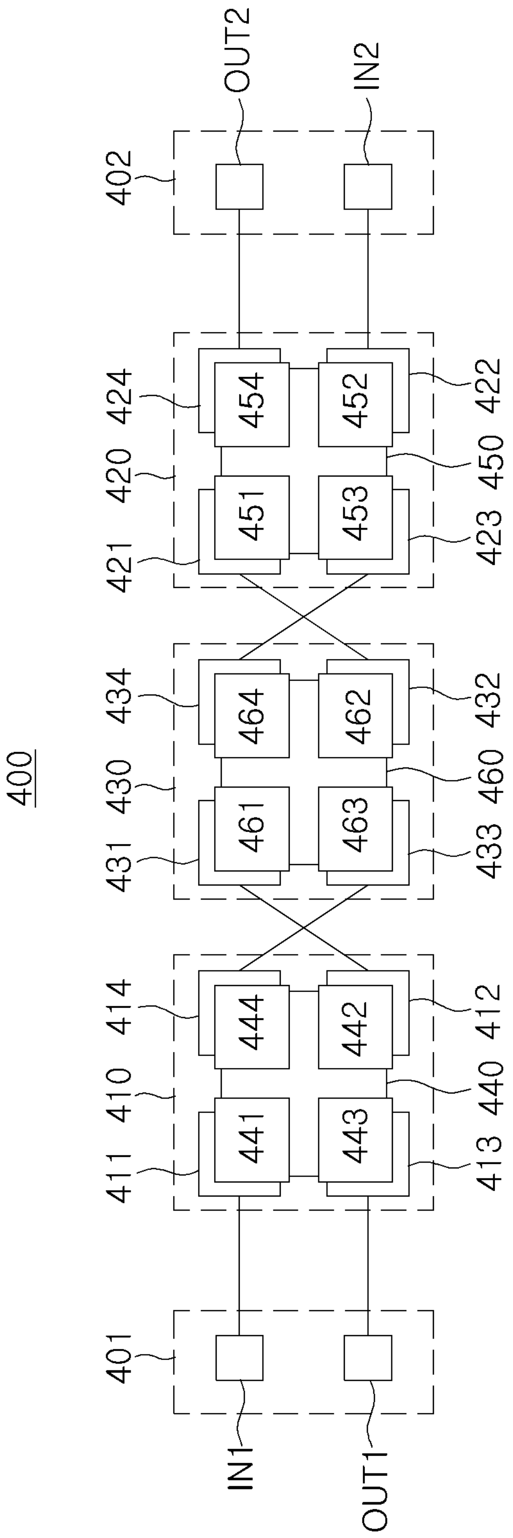
Figure 9:
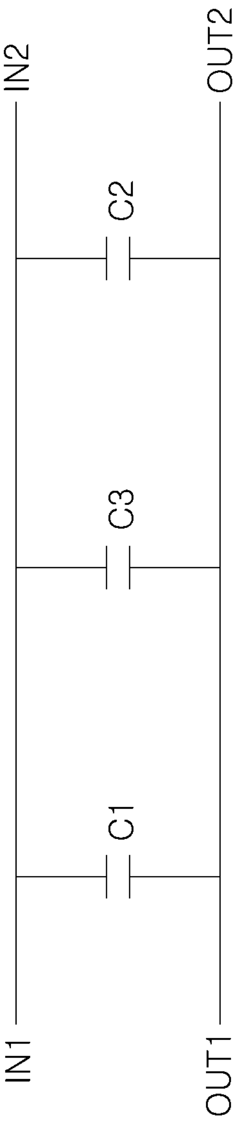
FIG. 9 is an equivalent circuit diagram illustrating four-terminal capacitors mounted on a test substrate according to one or more example embodiments.

FIGS. 7 and 8 are diagrams illustrating a test substrate according to one or more example embodiments. FIG. 9 is an equivalent circuit diagram illustrating four-terminal capacitors mounted on a test substrate according to one or more example embodiments.

Referring to one or more example embodiments shown in FIG. 7, a test substrate 400 according to one or more example embodiments may include a first input/output region 401 and a second input/output region 402, and a plurality of mounting regions 410, 420 and 430 connected therebetween. A first input pad IN1 and a first output pad OUT1 may be disposed in the first input/output region 401, and a second input pad IN2 and a second output pad OUT2 may be disposed in the second input/output region 402.

A plurality of pads 411, 412, 413 and 414, may be provided in a first mounting region 410. A plurality of pads 421, 422, 423, and 424, may be provided in a second mounting region. A plurality of pads 431, 432, 433 and 434 may be provided in a third mounting region 430. The first mounting region 410 may comprise a first positive pad 411 connected to the first input pad IN1, a second positive pad 412, a first negative pad 413 connected to the first output pad OUT1, and a second negative pad 414. The second mounting region 420 may comprise a third positive pad 421, a fourth positive pad 422 connected to the second input pad IN2, a third negative pad 423, and a fourth negative pad 424 connected to the second output pad OUT2.

A third mounting region 430 may comprise, a fifth positive pad 431, a sixth positive pad 432, a fifth negative pad 433, and a sixth negative pad 434 may be provided. The fifth positive pad 431 may be connected to the second positive pad 412, and the fifth negative pad 433 may be connected to the second negative pad 414. The sixth positive pad 432 may be connected to the third positive pad 421, and the sixth negative pad 434 may be connected to the third negative pad 423.

Referring to one or more example embodiments shown in FIG. 8, capacitors 440, 450 and 460 may be mounted in the plurality of mounting regions 410, 420 and 430. Referring to the first mounting region 410, the first positive pad 411 may be connected to a first terminal 441 of a first capacitor 440, and the second positive pad 412 may be connected to a second terminal 442. The first negative pad 413 may be connected to a third terminal 443 of the first capacitor 440, and the second negative pad 414 may be connected to a fourth terminal 444.

The first capacitor 440 may be a four-terminal capacitor, as described above with reference to FIGS. 2, 3 and 4. Accordingly, if a fault does not occur during a mounting process of mounting the first capacitor 440 in the first mounting region 410, then as the first capacitor 440 is mounted, the first positive pad 411 may be electrically connected to the second positive pad 412, and the first negative pad 413 may be electrically connected to the second negative pad 414. In addition, according to one or more example embodiments, the first positive pad 411 and the second positive pad 412 may be electrically isolated from the first negative pad 413 and the second negative pad 414.

A second capacitor 450 may be mounted in the second mounting region 420. Referring to the second mounting region 420, the third positive pad 421 may be connected to a first terminal 451, and the fourth positive pad 422 may be connected to a second terminal 452. The third negative pad 423 may be connected to a third terminal 453, and the fourth negative pad 424 may be connected to a fourth terminal 454.

A third capacitor 460 may be mounted in the third mounting region 430. Referring to the third mounting region 430, the fifth positive pad 431 may be connected to a first terminal 461, and the sixth positive pad 432 may be connected to a second terminal 462. The fifth negative pad 433 may be connected to a third terminal 463, and the sixth negative pad 434 may be connected to a fourth terminal 464.

If no fault has occurred during the mounting process of mounting the capacitors 440, 450 and 460 in the first, second and third mounting regions 410, 420 and 430, then the first input pad IN1 may be electrically connected to the second input pad IN2 through the capacitors 440, 450 and 460, and the first output pad OUT1 may be electrically isolated from the second output pad OUT2. Through the capacitors 440, 450 and 460, the first output pad OUT1 may be electrically connected to the second output pad OUT2, and the first output pad OUT1 may be electrically connected to the first input pad IN1 and the second input pad IN2.

Referring to one or more example embodiments shown in FIG. 9 illustrating a circuit 500 similar to that of one or more example embodiments shown in FIG. 8, first, second and third capacitors C1, C2 and C3 may be connected between the first input/output pads IN1 and OUT1 and the second input/output pads IN2 and OUT2. A pair of electrodes included in each of the first, second and third capacitors C1, C2 and C3 may be electrically isolated from each other by a dielectric material. Accordingly, the first and second input pads IN1 and IN2 may be electrically connected to each other, the first and second output pads OUT1 and OUT2 may be electrically connected to each other, and the first and second input pads IN1 and IN2 may be electrically isolated from the first and second output pads OUT1 and OUT2.

However, if a fault has occurred during a mounting process for at least one of the capacitors C1, C2 and C3, then an electrical connection and an isolation relationship between the first input and output pads IN1 and OUT1 and the second input and output pads IN2 and OUT2 may vary. According to one or more example embodiments, if a short-circuit fault has occurred during the mounting process for at least one of the capacitors C1, C2 and C3, then the first input pad IN1 and the first output pad OUT1 may be electrically connected to each other, and the second input pad IN2 may also be electrically connected to the second output pad OUT2. In addition, each of the capacitors C1, C2 and C3 may be a four-terminal capacitor. Thus, if an open-circuit fault has occurred during the mounting process for at least one of the capacitors C1, C2 and C3, then the first input pad IN1 and the second input pad IN2 may be electrically isolated from each other, or the first output pad OUT1 and the second output pad OUT2 may be electrically isolated from each other. In one or more example embodiments, an electrical signal may be input to one of the first input and output pads IN1 and OUT1 and the second input and output pads IN2 and OUT2, and the electrical signal may be detected from the other one of the first input and output pads IN1 and OUT1 and the second input and output pads IN2 and OUT2, thereby indicating whether an open-circuit fault or a short-circuit fault is present for at least one of the capacitors C1, C2 and C3.

Figure 10:
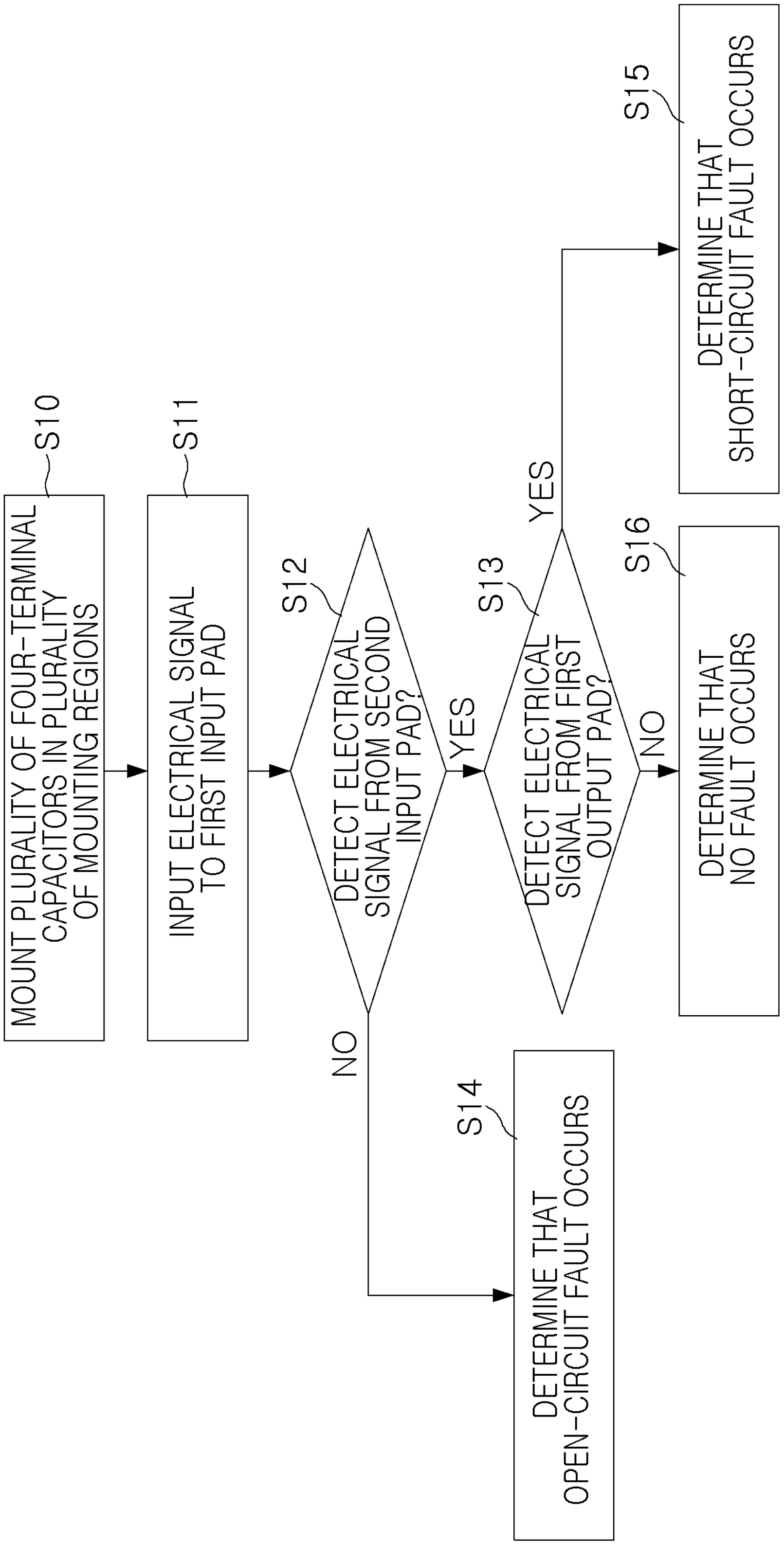
FIG. 10 is a flowchart illustrating a test method according to one or more example embodiments.

FIG. 10 is a flowchart illustrating a test method according to one or more example embodiments.

Referring to one or more example embodiments shown in FIG. 10, a test method according to one or more example embodiments may start with mounting a plurality of four-terminal capacitors in a plurality of mounting regions (operation S10). Each of the plurality of mounting regions may include four pads matched to four terminals included in each of the capacitors, and each of the plurality of mounting regions may be provided on a test substrate. In each of the plurality of mounting regions, the four pads may be electrically isolated from each other. Among the plurality of mounting regions, a first mounting region may be connected to a first input/output region, and a second mounting region may be connected to a second input/output region.

If the capacitors are mounted, a controller may input an electrical signal to a first input pad (operation S11), and may determine whether an electrical signal is detected from a second input pad (operation S12). If the electrical signal is detected from the second input pad in operation S12, then the controller may determine that a no open-circuit fault has occurred during a mounting process for the capacitors, and the controller may determine whether the electrical signal is detected from a first output pad (operation S13). If no electrical signal is detected from the second input pad, then the controller may determine that an open-circuit fault has occurred during a mounting process for at least one of the capacitors (operation S14).

If the electrical signal is detected from the first output pad in operation S13, then the controller may determine that a short-circuit fault has occurred during the mounting process for at least one of the capacitors (operation S15). Conversely, if the electrical signal is not detected from the first output pad in operation S13, then the controller may determine that no short-circuit fault has occurred during the mounting process for the capacitors (operation S16), and may end a test operation.

Unlike one or more example embodiments described with reference to FIG. 10, according to one or more example embodiments, the test operation for the capacitors may be performed by inputting an electrical signal to the second input pad instead of the first input pad. The controller may input an electrical signal to the second input pad, and may determine, based on whether the electrical signal is detected from the first input pad, whether an open-circuit fault has occurred during the mounting process for the capacitors. In addition, the controller may input an electrical signal to the second input pad, and may determine, based on whether the electrical signal is detected from a second output pad, whether a short-circuit fault has occurred during the mounting process for the capacitors.

If a short-circuit fault or an open-circuit fault is detected as a test result of the test method according to one or more example embodiments described with reference to FIG. 10, then the mounting process for the capacitors may be optimized with reference to the test result. As an example, according to one or more example embodiments, a force applied to the capacitors during the mounting process, the quantity of solder bumps inserted between pads of a package substrate and the capacitors, and the like, may be adjusted depending on the test result.

FIGS. 11, 12, 13 and 14 are diagrams illustrating a method of determining an open-circuit fault in a test method according to one or more example embodiments.

Referring to one or more example embodiments shown in FIGS. 11, 12, 13 and 14, a test substrate 600 may include a first input/output region 601, a second input/output region 602, and a plurality of mounting regions 610, 620 and 630. Capacitors 640, 650 and 660 may be mounted in the plurality of mounting regions 610, 620 and 630. A first positive pad 611 and a second positive pad 612 of a first mounting region 610 may be connected to a first terminal 641 and a second terminal 642 of a first capacitor 640, respectively. A first negative pad 613 and a second negative pad 614 may be connected to a third terminal 643 and a fourth terminal 644 of the first capacitor 640, respectively.

Referring to a second mounting region 620, a third positive pad 621 and a fourth positive pad 622 may be connected to a first terminal 651 and a second terminal 652 of a second capacitor 650, respectively. A third negative pad 623 and a fourth negative pad 624 may be connected to a third terminal 653 and a fourth terminal 654 of the second capacitor 650, respectively.

Referring to a third mounting region 630, a fifth positive pad 631 and a sixth positive pad 632 may be connected to a first terminal 661 and a second terminal 662 of a third capacitor 660, respectively. A fifth negative pad 633 and a sixth negative pad 634 may be connected to a third terminal 663 and a fourth terminal 664 of the third capacitor 660.

Figure 11:
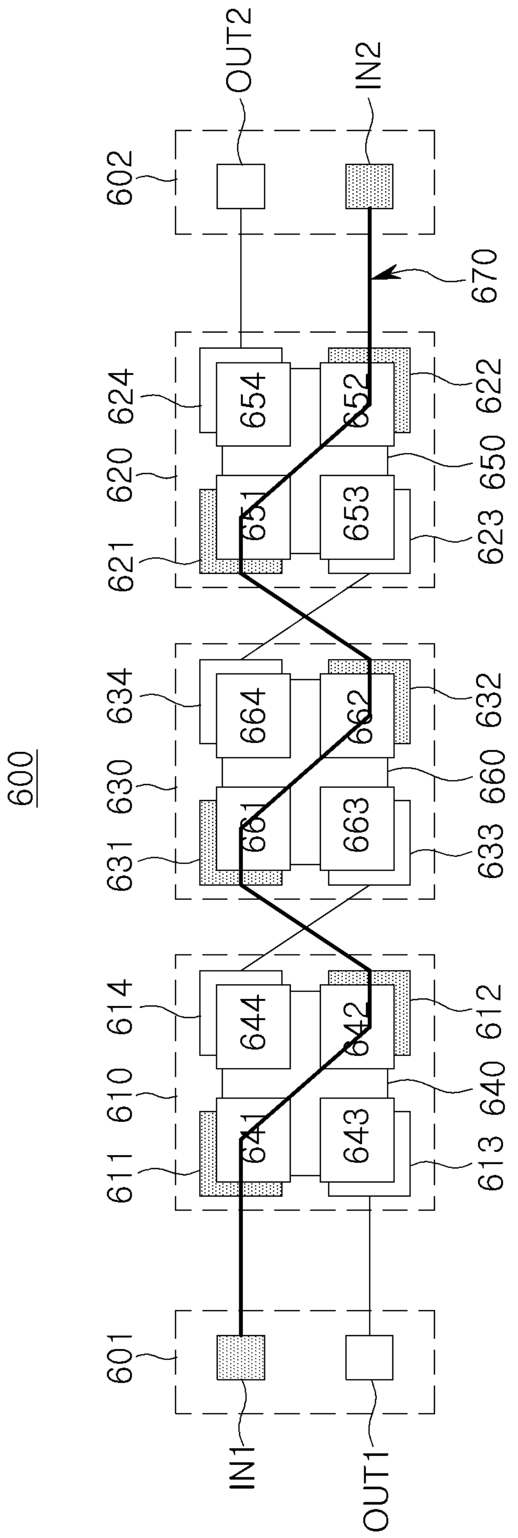
FIGS. 11, 12, 13 and 14 are diagrams illustrating a method of determining an open-circuit fault in a test method according to one or more example embodiments.

FIG. 11 shows a diagram illustrating a case in which no fault has occurred during a process of mounting the capacitors 640, 650 and 660 according to one or more example embodiments. In one or more example embodiments illustrated in FIG. 11, a controller connected to a test substrate 600 may input an electrical signal to the first input pad IN1. No fault may have occurred during the mounting process, and thus the electrical signal input to the first input pad IN1 may be detected from the second input pad IN2, and may not be detected from the first and second output pads OUT1 and OUT2.

For example, if a voltage having a first level is input to the first input pad IN1, a voltage having a level similar to the first level may be detected from the second input pad IN1. Conversely, a voltage having the first level, or a level similar thereto, may not be detected from the first output pad OUT1 and the second output pad OUT2.

Figure 12:
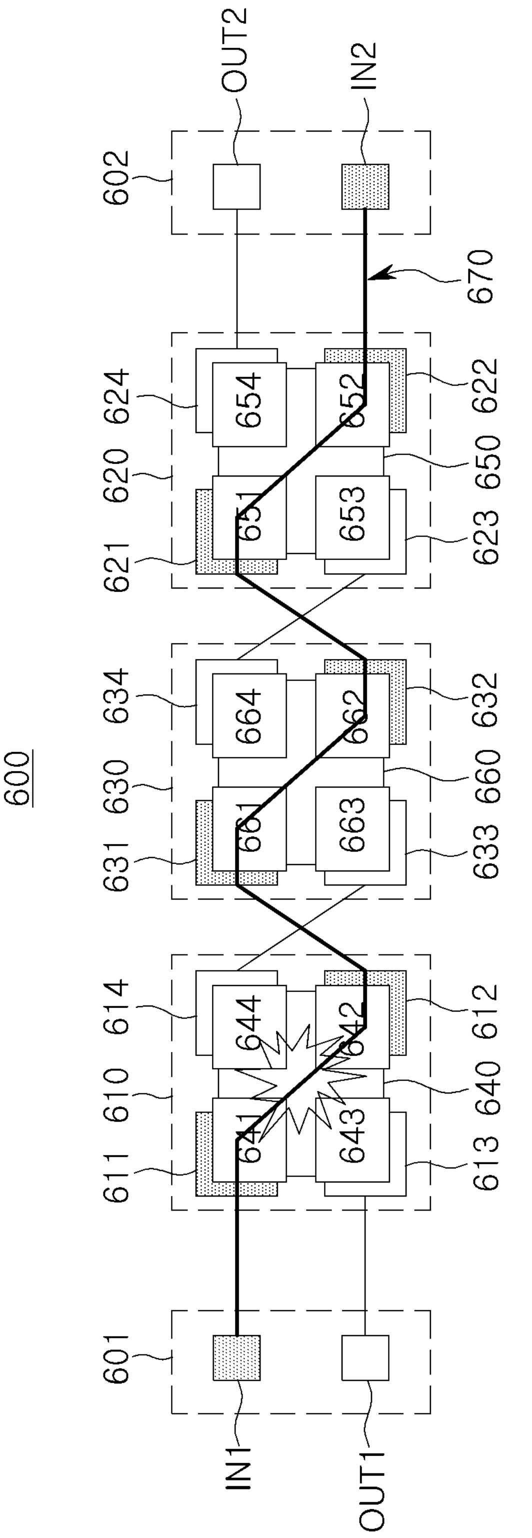

FIG. 12 is a diagram illustrating a case in which an open-circuit fault has occurred during a mounting process for at least one of the capacitors 640, 650 and 660, according to one or more example embodiments. In one or more example embodiments illustrated in FIG. 12, it is assumed that an open-circuit fault has occurred during a process of mounting the first capacitor 640, and the first input pad IN1 and the second input pad IN2 may be electrically isolated from each other by the open-circuit fault. Accordingly, the electrical signal input to the first input pad IN1 by the controller may not be detected from the second input pad IN2.

Figure 13:
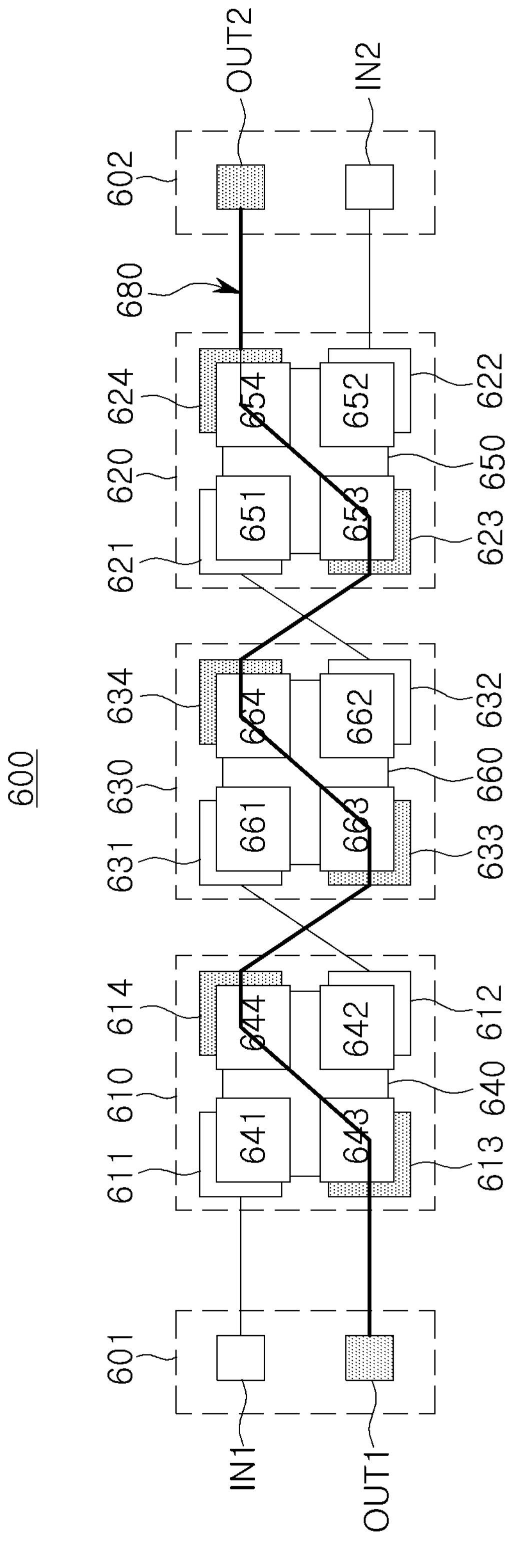

FIG. 13 is a diagram illustrating a case in which no fault has occurred during a mounting process for each of the capacitors 640, 650 and 660, according to one or more example embodiments, in a similar manner to FIG. 11. In one or more example embodiments illustrated in FIG. 13, the controller connected to the test substrate 600 may apply a predetermined voltage to the first output pad OUT1. Due to no fault occurring during the mounting process, the voltage applied to the first output pad OUT1 may be detected from the second output pad OUT2. Conversely, a voltage having a level applied to the first output pad OUT1 may not be detected from the first input pad IN1 and the second input pad IN2.

Figure 14:
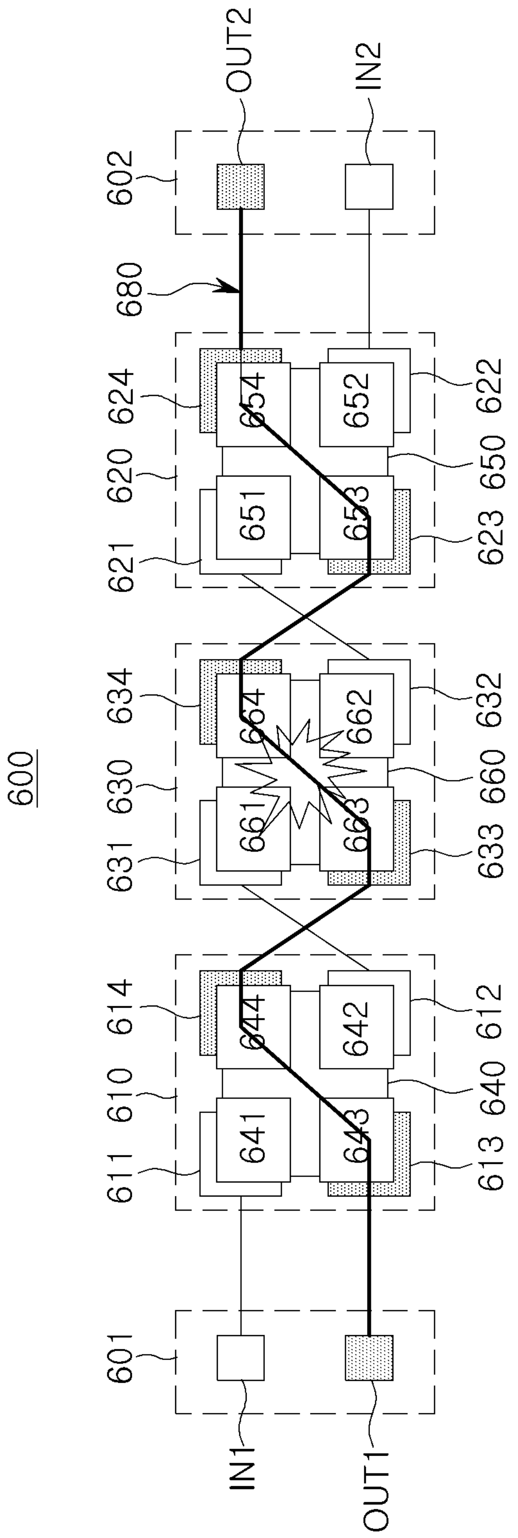

FIG. 14 is a diagram illustrating one or more example embodiments in which an open-circuit fault has occurred during a process of mounting at least one of the capacitors 640, 650 and 660, in a similar manner to one or more example embodiments shown in FIG. 12. In one or more example embodiments illustrated in FIG. 14, a crack may occur in a plurality of internal electrodes connected to the third terminal 663 and the fourth terminal 664 during a process of mounting the third capacitor 660, resulting in an open-circuit fault. Accordingly, the first output pad OUT1 and the second output pad OUT2 may be electrically isolated from each other, and a voltage input to the first output pad OUT1 by the controller may not be detected from the second output pad OUT2.

FIGS. 15, 16, 17 and 18 are diagrams illustrating a method of determining a short-circuit fault in a test method according to one or more example embodiments.

Referring to FIGS. 15, 16, 17 and 18, a test substrate 700 may include a first input/output region 701, a second input/output region 702, and a plurality of mounting regions 710, 720 and 730. Capacitors 740, 750 and 760 may be mounted in a plurality of mounting regions 710, 720 and 730. Respective connection relationships between a plurality of pads 711, 712, 713, 714, 721, 722, 723, 724, 731, 732, 733 and 734 provided in each of the plurality of mounting regions 710, 720 and 730 and a plurality of terminals 741, 742, 743, 744, 751, 752, 753, 754, 761, 762, 763 and 764, which are included in each of the plurality of capacitors 740, 750 and 760 may be similar to those described above with reference to one or more example embodiments shown in FIGS. 11, 12, 13 and 14.

Figure 15:
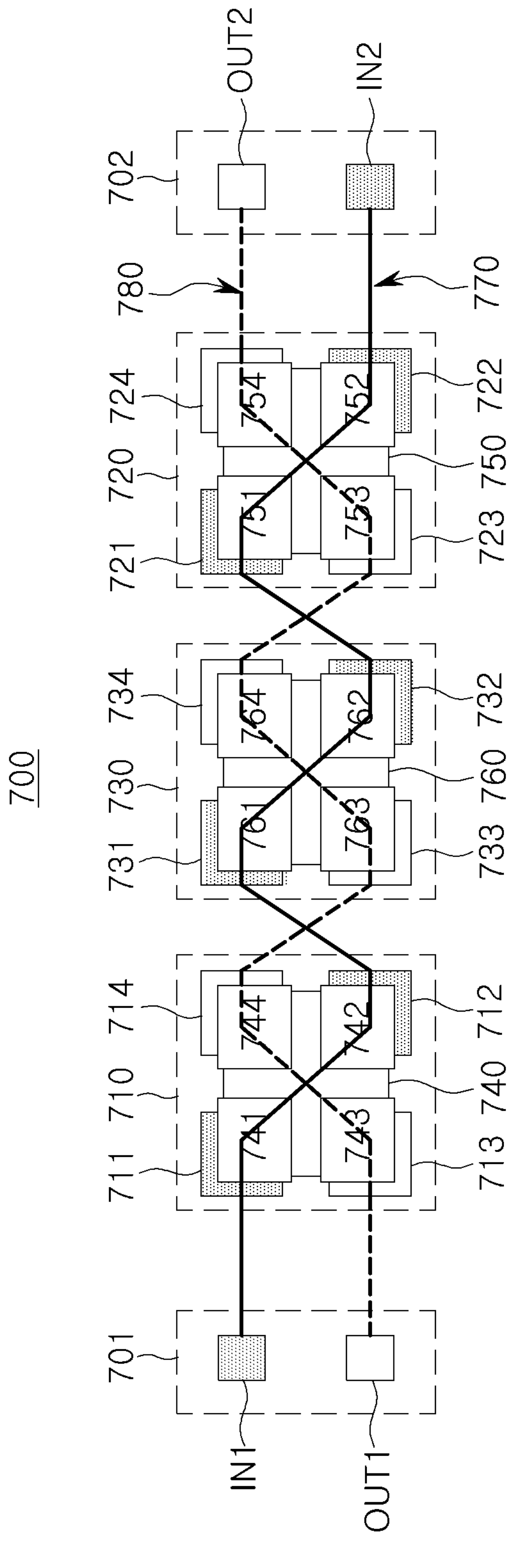
FIGS. 15, 16, 17 and 18 are diagrams illustrating a method of determining a short-circuit fault using a test method according to one or more example embodiments.

FIG. 15 is a diagram illustrating a case in which no fault has occurred during a mounting process of connecting the capacitors 740, 750 and 760 to the plurality of mounting regions 710, 720 and 730 according to one or more example embodiments. Accordingly, as illustrated in one or more example embodiments shown in FIG. 15, a first connection path 770 may be formed between the first input pad IN1 and the second input pad IN2, and a second connection path 780 may be formed between the first output pad OUT1 and the second output pad OUT2. The first connection path 770 and the second connection path 780 may be isolated from each other.

In one or more example embodiments illustrated in FIG. 15, a controller connected to the test substrate 700 may input an electrical signal to the first input pad IN1. As an example, if the controller inputs a voltage having a first level to the first input pad IN1, a voltage having the first level or a level similar thereto may be detected from the second input pad IN2. In addition, the voltage having a level corresponding to the first level may not be detected from the first output pad OUT1 and the second output pad OUT2.

Figure 16:
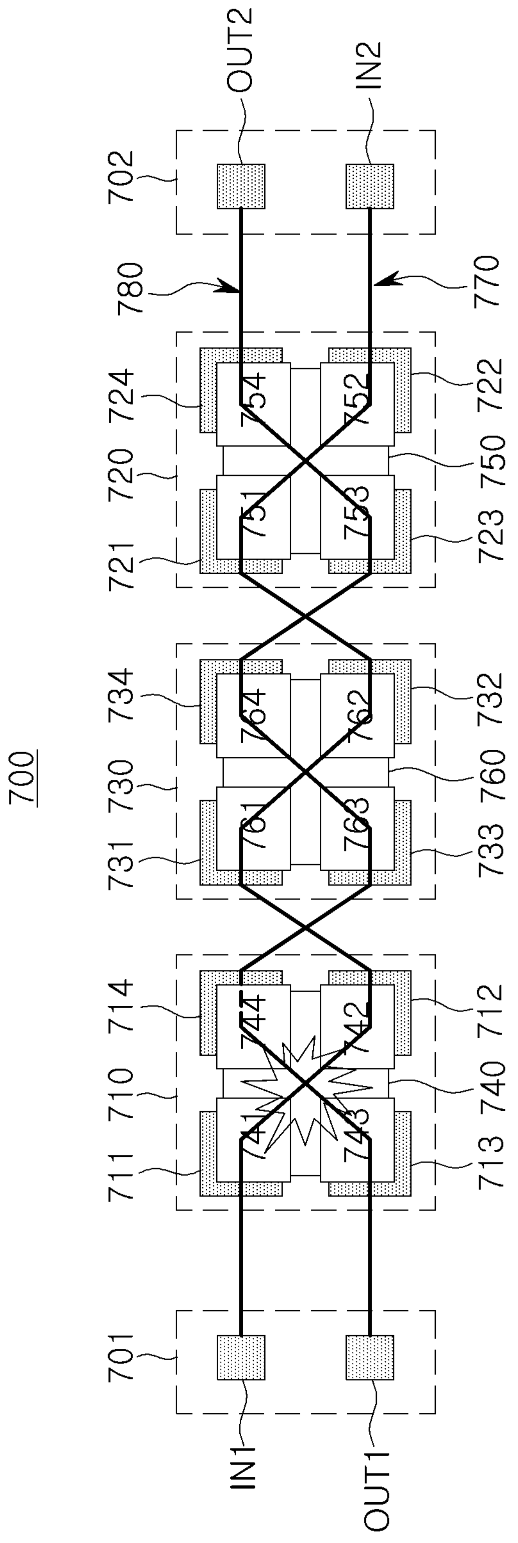

FIG. 16 is a diagram illustrating a case in which a short-circuit fault has occurred during a mounting process for at least one of the capacitors 740, 750 and 760, according to one or more example embodiments. In one or more example embodiments illustrated in FIG. 16, it is assumed that a short-circuit fault has occurred during a mounting process of connecting the first capacitor 740 to the first mounting region 710, and the first connection path 770 and the second connection path 780 may be electrically connected to each other by the short-circuit fault. Accordingly, if the controller inputs a voltage having a first level to the first input pad IN1, a voltage having the first level or a level similar thereto may also be detected from the first output pad OUT1 the second output pad OUT2 as well as the second input pad IN2.

Figure 17:
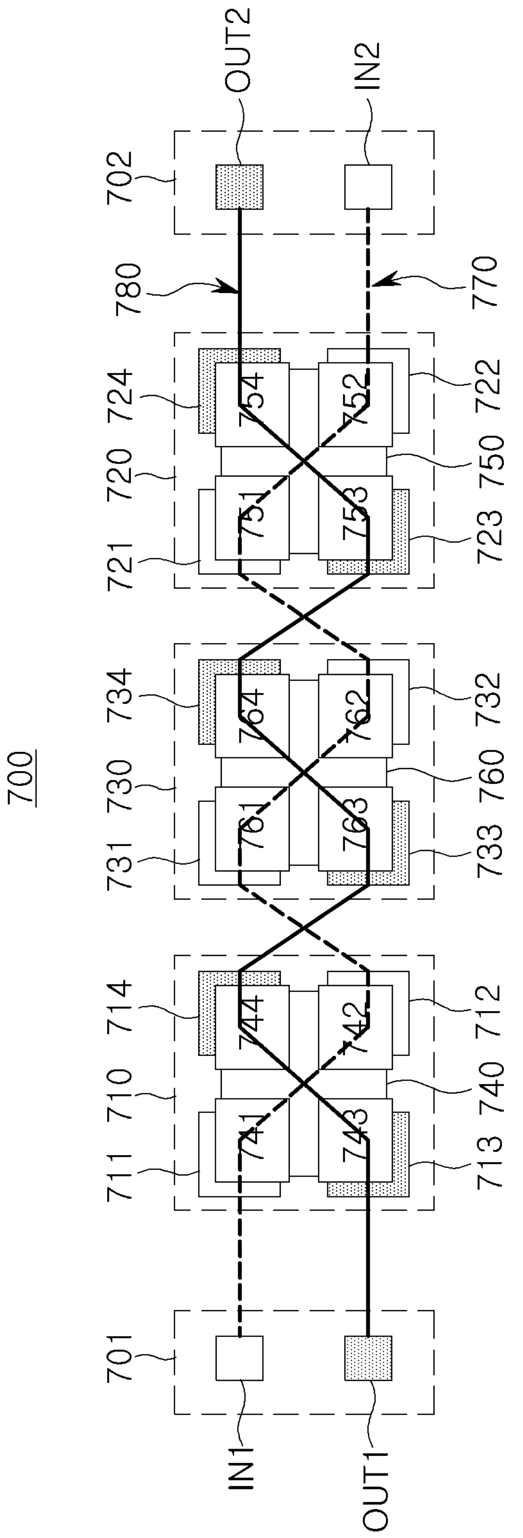

FIG. 17 is a diagram illustrating a case in which no fault has occurred during a mounting process for each of the capacitors 740, 750 and 760, according to one or more example embodiments, in a similar manner to one or more example embodiments shown in FIG. 15. In one or more example embodiments illustrated in FIG. 17, a controller may apply a predetermined voltage to the first output pad OUT1. Due to no fault occurring during the mounting process for the capacitors 740, 750 and 760, the voltage applied to the first output pad OUT1 may be detected from the second output pad OUT2 through the second connection path 780. In addition, the first connection path 770 and the second connection path 780 may be electrically isolated from each other, such that the voltage having a level applied to the first output pad OUT1 may not be detected from the first input pad IN1 and the second input pad IN2.

Figure 18:
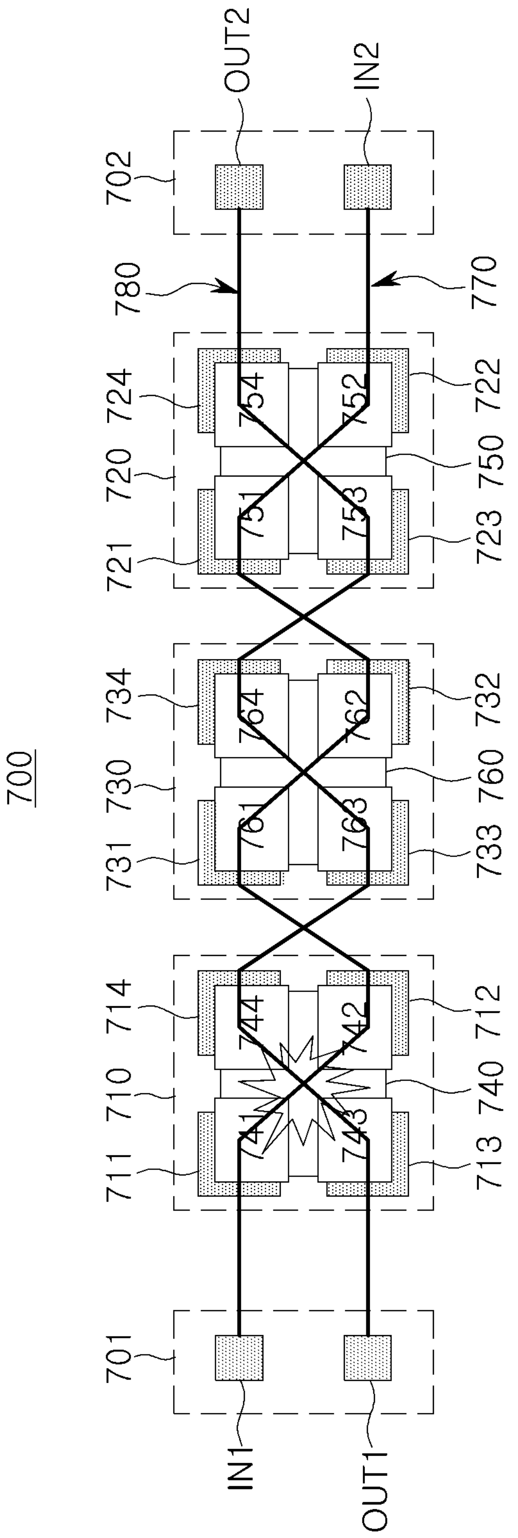

FIG. 18 is a diagram illustrating a case in which a short-circuit fault has occurred during a mounting process for at least one of the capacitors 740, 750 and 760, according to one or more example embodiments, in a similar manner to FIG. 16. In one or more example embodiments illustrated in FIG. 18, it is assumed that a short-circuit fault has occurred during a mounting process for the first capacitor 740, and first to fourth terminals 741 to 744 of the first capacitor 740 may all be electrically connected to each other by the short-circuit fault. As an example, if an excessively large quantity of solder bumps is input to the mounting process, the solder bumps may come into contact with each other, such that the first to fourth terminals 741 to 744 may be electrically connected to each other. Accordingly, as illustrated according to one or more example embodiments shown in in FIG. 18, the first connection path 770 and the second connection path 780 may be electrically connected to each other, and a voltage having a level equal to or corresponding to a level applied to the first output pad OUT1 by the controller may be detected not only from the second output pad OUT2 but also from the first input pad IN1 and the second input pad IN2.

In one or more example embodiments, mounting regions having a plurality of pads isolated from each other may be formed on a package substrate. Some of the pads included in a first mounting region may be connected to first input and output pads, and some of the pads included in a second mounting region may be connected to second input and output pads. A four-terminal capacitor may be mounted on each of the mounting regions. An electrical signal may be applied to one of the first input and output pads and the second input and output pads, and the electrical signal may be detected from the other one of the first input and output pads and the second input and output pads, and thereby an open-circuit fault and a short-circuit fault that may occur during a process of mounting the capacitors may be detected.

According to one or more example embodiments, an open-circuit fault and a short-circuit fault may be tested without changing a form in which capacitors are mounted. As an example, a form in which the capacitors 640, 650 and 660 are mounted in one or more example embodiments described with reference to FIGS. 11, 12, 13 and 14, may be the same as a form in which the capacitors 740, 750 and 760 are mounted in one or more example embodiments described with reference to FIGS. 15, 16, 17 and 18. In other words, as described with reference to FIGS. 11, 12, 13 and 14, whether an open-circuit fault has occurred during a process of mounting the capacitors 640, 650 and 660 may be tested, and then whether a short-circuit fault has occurred may be tested based on whether an electrical signal input to the first input pad IN1 is detected from the first output pad OUT1.

As a result, as described with reference to FIGS. 11, 12, 13, 14, 15, 16 and 17, in one or more example embodiments, capacitors may be directly mounted on a test substrate, and some of input pads and output pads may be selected to apply and detect an electrical signal, thereby determining whether a fault has occurred during a process of mounting the capacitors. If it is determined that an open-circuit fault and/or a short-circuit fault has occurred, a test result may be used to control a mounting process of mounting the capacitors on a package substrate in a subsequent packaging process for producing a semiconductor package including a capacitor.

In one or more example embodiments, capacitors may be mounted once on a test substrate without the need to mount the capacitors several times, and both a short-circuit fault and an open-circuit fault may be determined. Accordingly, a yield of a package process may be improved by rapidly determining whether a fault has occurred during a mounting process and by optimizing the mounting process based on the determination. As an example, if an open-circuit fault has occurred, the quantity of solder bumps used during the mounting process may be increased. Conversely, if a short-circuit fault has occurred, the quantity of solder bumps used during the mounting process may be reduced. In addition, if a fault has occurred, a force for coupling a capacitor and a package substrate to each other may be changed such that a crack does not occur in the capacitor during the mounting process.

While example embodiments have been shown and described above, it will be apparent to those skilled in the art that modifications and variations may be made without departing from the spirit and scope as defined by the appended claims.

What is claimed is:

1. A substrate comprising:

a first input/output region;

a first input pad provided in the first input/output region;

a first output pad provided in the first input/output region;

a first mounting region;
a first positive pad provided in the first mounting region and connected to the first input pad;
a first negative pad provided in the first mounting region connected to the first output pad;
a second positive pad provided in the first mounting region;
a second negative pad provided in the first mounting region;
a second mounting region;
a third positive pad provided in the second mounting region and connected to the second positive pad;
a third negative pad provided in the second mounting region and connected to the second negative pad;
a fourth positive pad provided in the second mounting region;
a fourth negative pad provided in the second mounting region;
a second input/output region;
a second input pad provided in the second input/output region and connected to the fourth positive pad; and
a second output pad provided in the second input/output region and connected to the fourth negative pad,
wherein the first positive pad is electronically isolated from the second positive pad,
wherein the first negative pad is electronically isolated from the second negative pad,
wherein the third positive pad is electronically isolated from the fourth positive pad,
wherein the third negative pad is electronically isolated from the fourth negative pad,
wherein the first positive pad and the second positive pad are arranged in a first direction, and
wherein the first negative pad and the second negative pad are arranged in a second direction intersecting the first direction.

2. The substrate of claim 1, further comprising:
a base substrate;
a first interconnection pattern, a second interconnection pattern, a third interconnection pattern, a fourth interconnection pattern, a fifth interconnection pattern and a sixth interconnection pattern that are provided on the base substrate,
wherein the first interconnection pattern connects the first input pad to the first positive pad,
wherein the second interconnection pattern connects the first output pad to the first negative pad,
wherein the third interconnection pattern connects the fourth positive pad to the second input pad,
wherein the fourth interconnection pattern connects the fourth negative pad to the second output pad,
wherein the fifth interconnection pattern connects the second positive pad to the third positive pad, and
wherein the sixth interconnection pattern connects the second negative pad to the third negative pad.

3. The substrate of claim 2, wherein the first input/output region, the second input/output region, the first mounting region, and the second mounting region are provided on a surface of the base substrate,
wherein the base substrate comprises a redistribution layer, and
wherein the redistribution layer comprises the first interconnection pattern, the second interconnection pattern, the third interconnection pattern, the fourth interconnection pattern, the fifth interconnection pattern, and the sixth interconnection pattern.

4. The substrate of claim 1, wherein the third positive pad and the fourth positive pad are arranged in the first direction, and
wherein the third negative pad and the fourth negative pad are arranged in the second direction.

5. The substrate of claim 1, wherein the third positive pad and the fourth positive pad are arranged in the second direction, and
wherein the third negative pad and the fourth negative pad are arranged in the first direction.

6. A device comprising:
a substrate comprising:
a plurality of mounting regions;
a plurality of four-terminal capacitors that are mounted in the plurality of mounting regions;
a first input/output region electrically connected to a first mounting region from among the plurality of mounting regions; and
a second input/output region electrically connected to a second mounting region from among the plurality of mounting regions; and
a controller configured to determine whether mounting faults of the plurality of four-terminal capacitors occur when the plurality of four-terminal capacitors are mounted in the plurality of mounting regions, by applying an electrical signal to each of the first input/output region and the second input/output region,
wherein the first input/output region comprises a first input pad,
wherein each of the plurality of mounting regions comprises a first positive pad, a second positive pad, a first negative pad, and a second negative pad that are electrically isolated from each other,
wherein the first positive pad and the second positive pad are arranged in a first direction, and
wherein the first negative pad and the second negative pad are arranged in a second direction intersecting the first direction.

7. The device of claim 6, wherein the first input pad is connected to one from among the first positive pad and the second positive pad in the first mounting, and
wherein the device further comprises:
a first output pad provided in the first input/output region and connected to one from among the first negative pad and the second negative pad in the first mounting region;
a second input pad provided in the second input/output region and connected to one from among the first positive pad and the second positive pad in the second mounting region; and
a second output pad provided in the second input/output region and connected to one from among the first negative pad and the second negative pad in the second mounting region.

8. The device of claim 7, wherein the controller is further configured to determine that an open-circuit fault has occurred while at least one from among the plurality of four-terminal capacitors is mounted on the substrate, based on the electrical signal input to the first input pad not being detected from the second input pad.

9. The device of claim 7, wherein the controller is further configured to determine that an open-circuit fault has occurred while at least one from among the plurality of four-terminal capacitors is mounted on the substrate, based on the electrical signal applied to the first output pad not being detected from the second output pad.

10. The device of claim 7, wherein the controller is further configured to determine that a short-circuit fault has occurred while at least one from among the plurality of four-terminal capacitors is mounted on the substrate, based on the electrical signal input to the first input pad being detected from the first output pad.

11. The device of claim 7, wherein the controller is further configured to determine that a short-circuit fault has occurred while at least one from among the plurality of four-terminal capacitors is mounted on the substrate, based on the electrical signal input to the second input pad being detected from the second output pad.

12. The device of claim 6, wherein the substrate further comprises:

a first side surface extending in the first direction; and a second side surface extending in the second direction intersecting the first direction.

13. The device of claim 6, wherein, in the second mounting region, the first positive pad and the second positive pad are arranged in the second direction, and the first negative pad and the second negative pad are arranged in the first direction.

14. A method comprising:

mounting capacitors in a first mounting region and a second mounting region of a substrate, wherein the first mounting region including a first pad, a second pad, a third pad and a fourth pad that are electrically isolated from each other, and the second mounting region including a fifth pad, a sixth pad, a seventh pad and an eighth pad that are electrically isolated from each other;

inputting an electrical signal to a first input pad connected to the first pad;

detecting the electrical signal from a first output pad connected to the second pad, and a second input pad connected to the third pad; and determining whether a fault has occurred in the mounting the capacitors, based on the electrical signal being detected from the first output pad or the electrical signal not being detected from the second input pad, wherein, in the first mounting region, the first pad and the third pad are arranged in a first direction, and wherein the second pad and the fourth pad are arranged in a second direction intersecting the first direction.

15. The method of claim 14, wherein the determining whether the fault has occurred in the mounting the capacitors comprises determining that a short-circuit fault has occurred in the mounting the capacitors, based on the electrical signal being detected from the first output pad.

16. The method of claim 14, wherein the determining whether the fault has occurred in the mounting the capacitors comprises determining that an open-circuit fault has occurred in the mounting the capacitors, based on the electrical signal not being detected from the second input pad.

17. The method of claim 14, wherein the electrical signal has a predetermined level of voltage, and wherein the determining whether the fault has occurred in the mounting the capacitors comprises determining whether the fault has occurred in the mounting the capacitors by detecting a voltage of each of the first output pad and the second input pad.

* * * * *